United States Patent
Parris

(10) Patent No.: US 7,161,214 B2
(45) Date of Patent: Jan. 9, 2007

(54) REDUCED GATE DELAY MULTIPLEXED INTERFACE AND OUTPUT BUFFER CIRCUIT FOR INTEGRATED CIRCUIT DEVICES INCORPORATING RANDOM ACCESS MEMORY ARRAYS

(75) Inventor: Michael C. Parris, Colorado Springs, CO (US)

(73) Assignees: United Memories, Inc., Colorado Springs, CO (US); Sony Corporation, Tokyo (JP)

(*) Notice: Subject to any disclaimer, the term of this patent is extended or adjusted under 35 U.S.C. 154(b) by 33 days.

(21) Appl. No.: 10/345,735

(22) Filed: Jan. 16, 2003

(65) Prior Publication Data
US 2004/0141401 A1    Jul. 22, 2004

(51) Int. Cl.
*H01L 29/72* (2006.01)

(52) U.S. Cl. ............. 257/365; 257/310; 365/200; 365/208; 365/189.05; 365/230.03

(58) Field of Classification Search ............ 257/295, 257/310, 365; 365/200, 208, 230.18, 189.05, 365/238.03
See application file for complete search history.

(56) References Cited

U.S. PATENT DOCUMENTS

| 5,016,226 A | * | 5/1991 | Hiwada et al. ........... 365/233 |
| 5,239,507 A | * | 8/1993 | Ohba ................... 365/189.06 |
| 5,404,564 A | * | 4/1995 | Hiwada et al. ........... 711/211 |
| 5,506,808 A | * | 4/1996 | Yamada et al. .......... 365/208 |
| 5,805,522 A |   | 9/1998 | Sukegawa et al. |
| 5,926,434 A | * | 7/1999 | Mori ..................... 365/233 |
| 6,215,721 B1 |   | 4/2001 | Kim |

FOREIGN PATENT DOCUMENTS

| JP | 09-073778   | 3/1997 |
| JP | 2001-093276 | 4/2001 |

* cited by examiner

*Primary Examiner*—Edward Wojciechowicz
(74) *Attorney, Agent, or Firm*—William J. Kubida; Peter J. Meza; Hogan & Hartson LLP

(57) ABSTRACT

A reduced gate delay multiplexed interface and output buffer circuit for random access memory arrays, such as synchronous dynamic random access memory ("SDRAM") devices, or other integrated circuit devices incorporating embedded memory arrays which reduces data access time and clock latency. In accordance with the present invention, data is multiplexed (or selected) and driven out at the memory bank level rather than at the output pad area (or the embedded RAM macro edge) as in prior art techniques.

22 Claims, 6 Drawing Sheets

REDUCED GATE DELAY MULTIPLEXED INTERFACE AND OUTPUT BUFFER CIRCUIT FOR INTEGRATED CIRCUIT DEVICES INCORPORATING RANDOM ACCESS MEMORY ARRAYS

BACKGROUND OF THE INVENTION

The present invention relates, in general, to the field of integrated circuit ("IC") devices incorporating memory arrays. More particularly, the present invention relates to a reduced gate delay multiplexed interface and output buffer circuit for integrated circuit memory devices and those devices incorporating embedded random access memory arrays.

Many types of DRAM based devices, or integrated circuits including embedded memory arrays, are currently available including extended data out ("EDO"), synchronous DRAM ("SDRAM"), double data rate ("DDR") DRAM and the like. Regardless of configuration, the primary purpose of the DRAM is to store data. Functionally, data may be written to the memory, read from it or periodically refreshed to maintain the integrity of the stored data. In current high density designs, each DRAM memory cell comprises a single pass transistor coupled to an associated capacitor that may be charged to store a value representative of either a logic level "1" or "0". Data stored in these memory cells may be read out and written to them through columns of sense amplifiers coupled to complementary bit lines interconnecting rows of these cells.

Currently, output drivers are placed at or near the edge of the chip in integrated circuit memory devices or adjoining the edge of the macro in those devices including embedded memory arrays. This placement and the concomitant circuitry required can lead to overall performance problems in the "read" data path. For example, commodity DRAMs will typically have an output capacitance ("C") specification of 50 pF (or 30 pF to 100 pF) so that placing an output driver remote from the edge of the chip will not significantly add to the load capacitance that the output buffer has to drive. However, the biggest problem is not with capacitance but resistance ("R"), where, for example, 100 ohms in series with this 50 pF load would place a 5.0 mSec lumped RC adder onto any access time. In previous generations of DRAMs, it was difficult to keep this resistance sufficiently low without placing the output buffer right at the output pad. For embedded DRAMs, the output load capacitance is generally less, with typical specifications on this parameter on the order of 0.2 pF.

SUMMARY OF THE INVENTION

Disclosed herein is a reduced gate delay multiplexed interface and output buffer circuit for random access memory arrays, such as synchronous dynamic random access memory ("SDRAM") devices, or other integrated circuit devices incorporating embedded memory arrays which reduces data access time and clock latency. In accordance with the present invention, data is multiplexed (or selected) and driven out at the memory bank level rather than at the output pad area (or the embedded RAM macro edge) as in prior art techniques.

If output drivers are removed from the edge of the chip or the edge of the macro and instead placed at the interface of each bank of a memory array, then performance of the read path can be improved over that of conventional designs. As previously noted, in previous generations of DRAMs, it was difficult to keep the resistance of the data path sufficiently low without placing the output buffer right at the device output pad. However, with today's advanced multi-level metal technologies, it is now feasible to route a low resistance path from an output buffer to a bond pad. In accordance with the present invention, by placing the driver adjacent to, or in, a memory bank interface, several gates can be removed from the output data path thereby enhancing memory access time.

In prior art circuits, multiplexing data read ("DR") lines from different banks on to the global data read ("GDR") lines occurred with bank address information incorporated in with the clock used for the particular bank interface. In accordance with the disclosure of the present invention, this is effectuated through the use of a sense amplifier enable signal that also tri-states the output stage, or driver, for each bank interface. This sense amplifier enable signal also has bank address information in with its generator. Through the implementation of the novel interface and output buffer circuit of the present invention, not only is $t_{AC}$ (access time) improved by removing several gates in the output path, but also clock latency for "read" accesses is removed, resulting in an overall faster "read" access time.

Particularly disclosed herein is an integrated circuit device which comprises a plurality of memory banks and an interface and output buffer circuit associated with each of the plurality of memory banks with each of the interface and output buffer circuits being coupled to a data output line of the device.

Also disclosed herein is an integrated circuit device which comprises a plurality of memory banks; and an interface and buffer circuit associated with each of the plurality of memory banks, wherein the interface and buffer circuit comprises a main sense amplifier circuit operative in response to an enable signal and an output stage coupled to the main sense amplifier circuit and a data output line of the device, the output stage being operative in response to a delayed enable signal.

Further disclosed herein is an integrated circuit device including a sub-array interface circuit for selectively coupling complementary data read local lines to corresponding complementary data read lines. The sub-array interface circuit comprises a first switching device for selectively coupling a first of the complementary data read local lines to a first of the complementary data read lines with the first switching device having a control terminal thereof coupled to receive a read enable signal. A second switching device selectively couples a second of the complementary data read local lines to a second of the complementary data read lines with the second switching device having a control terminal thereof coupled to also receive the read enable signal. A third switching device selectively couples the first and second of the complementary read data lines with the third switching device having a control terminal thereof coupled to receive a complement of the read enable signal.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 6 is a schematic illustration of a sub-array interface circuit also for possible use in conjunction with the memory device of the preceding figure.

DESCRIPTION OF A REPRESENTATIVE EMBODIMENT

Figure 1:
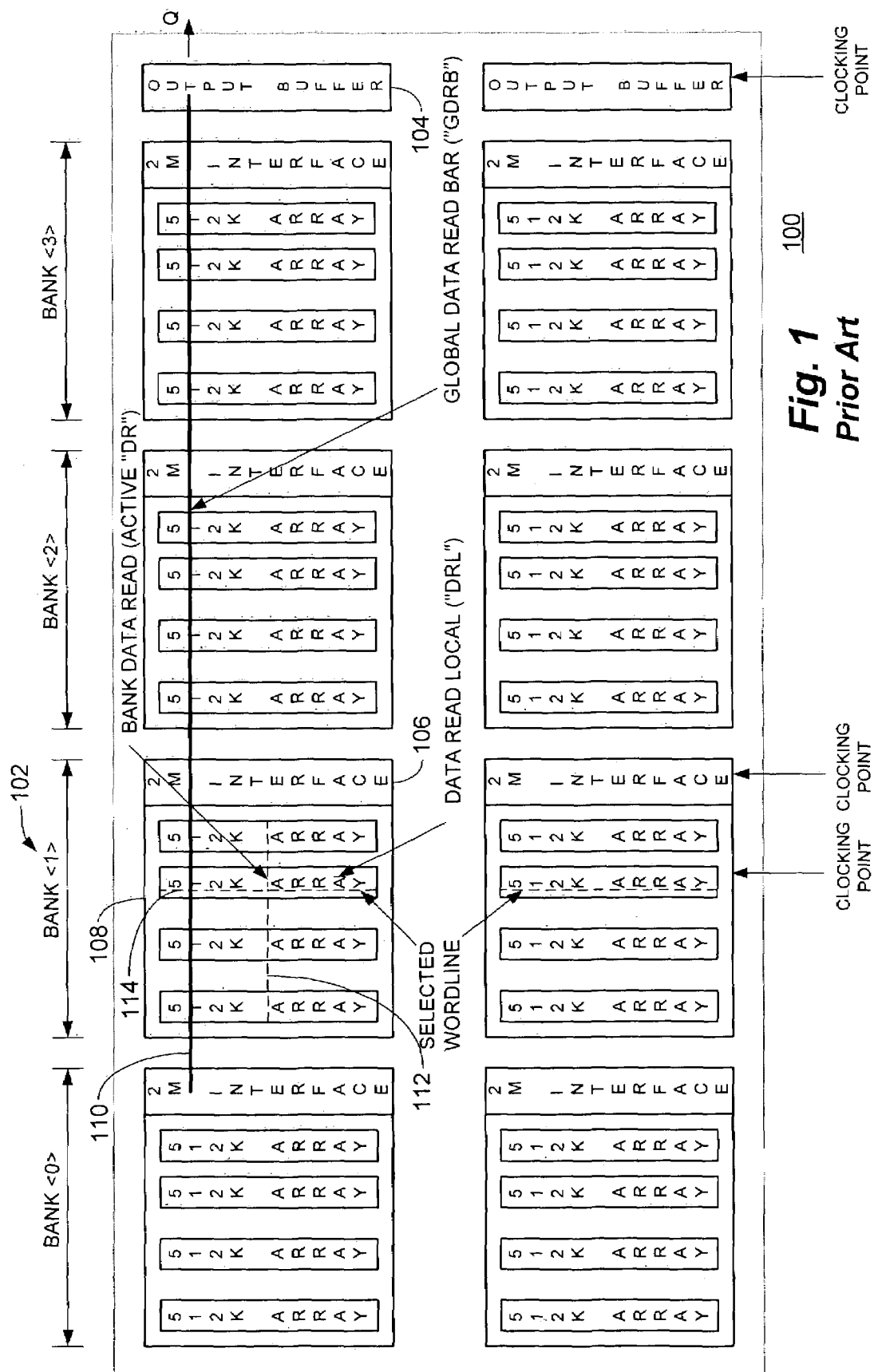
FIG. 1 is a simplified functional block diagram of a conventional synchronous DRAM "SDRAM" device architecture illustrating the global data read bar ("GDRB") line which extends across the individual bank interfaces to the memory interface (or output buffer) of the memory array.

With reference now to FIG. 1, a simplified functional block diagram of a conventional synchronous DRAM "SDRAM" device 100 architecture is shown. The device 100 comprises a memory array partitioned into a number of banks 10 (e.g. BANK<0> through BANK<3>) and includes an output buffer 104 for transferring the data read from the memory array on output line Q. Each of the banks 102 includes a respective clocked bank interface 106 as shown. A number of individual memory arrays 108, each comprising a number of sub-arrays, together with the bank interfaces 106 form the device 100 memory array.

A global data read bar line ("GDRB") 110 provides the data to be read from the memory banks 102 to the Q output line and is coupled to each of the bank interfaces 106. As shown, each of the memory banks 102 has a respective bank data read line ("DR"; the complementary "DRB" lines are not shown) 112. Clocked sub-array interfaces (not shown) are coupled to data read local lines ("DRL"; the complementary "DRLB" lines are not shown) 114 as illustrated.

In this conventional embodiment of a device 100, the output buffer 104 is clocked by a first clocking signal while the individual bank interfaces 106 are also clocked by a second clocking signal. In addition, the sub-array interfaces coupled to the DRB lines 114 are also clocked by a third clocking signal. Conventionally, these three clocking signals may be three different phases (or half phases) of the input clock signal.

Figure 2:
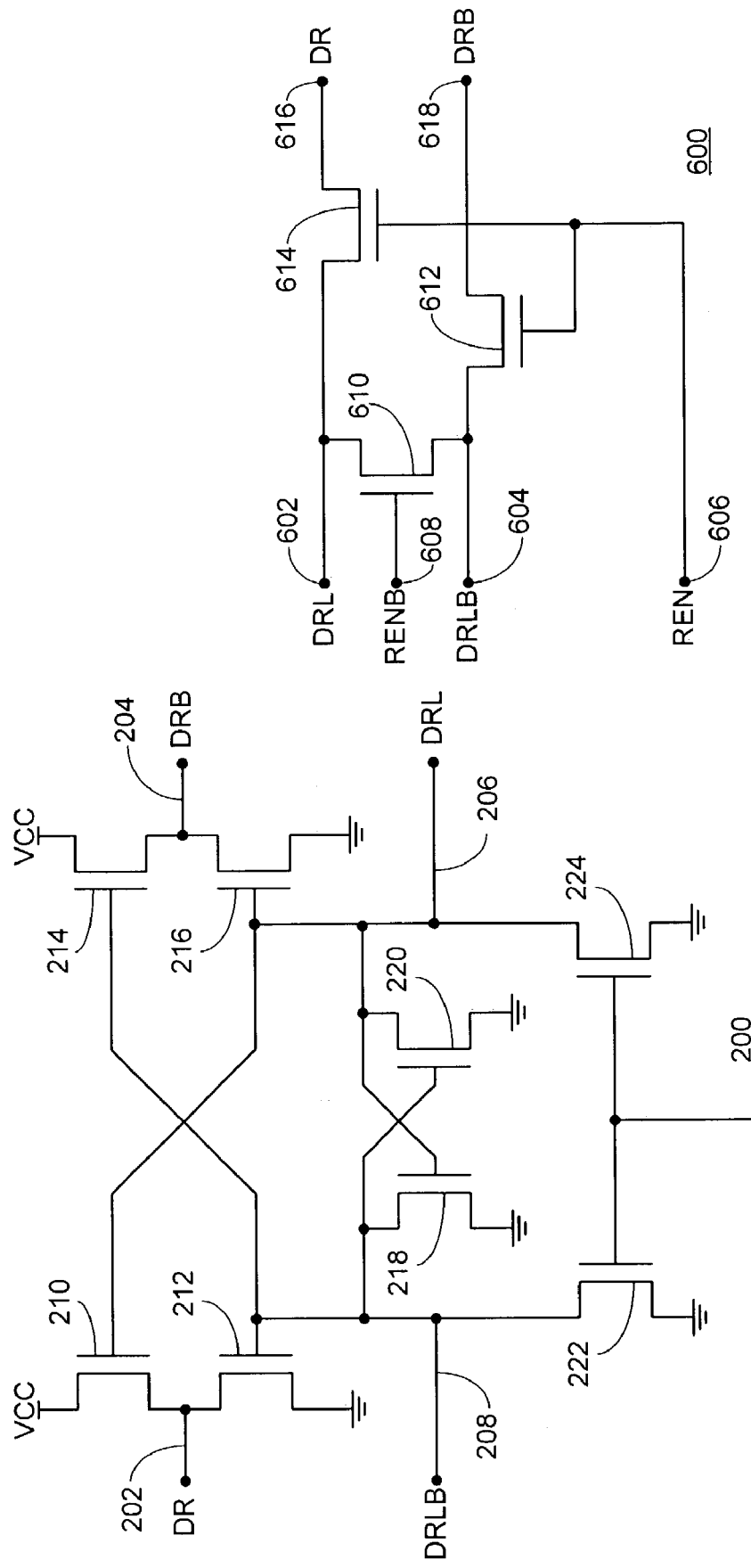
FIG. 2 is a schematic illustration of a prior art sub-array interface circuit forming a portion of the conventional SDRAM device of the preceding figure.

With reference additionally now to FIG. 2, a schematic illustration of a prior art sub-array interface circuit 200 is shown. The sub-array interface circuit 200 forms a portion of the conventional SDRAM device 100 of the preceding figure.

Complementary bank data read ("DR" and "DRB") signals are output from the sub-array interface circuit 200 on lines 202 and 204 respectively in response to complementary data read local ("DRL" and "DRLB") signals input on lines 206 and 208 respectively. Series connected N-channel transistors 210 and 212 are coupled between a supply voltage source ("VCC") and circuit ground and the node intermediate the two defines the DR line 202. Similarly, series connected N-channel transistors 214 and 216 are also coupled between VCC and circuit ground and the node intermediate the two defines the DRB line 204. The gate terminals of transistors 210 and 216 are coupled to the DRLB line 208 while the gate terminals of transistors 212 and 214 are coupled to the DRL line 206.

N-channel transistor 218 has one terminal coupled to the DRLB line 208 and the opposite terminal to circuit ground. Its gate terminal is connected to the DRL line 206. In like manner, N-channel transistor 2220 also has one terminal coupled to the DRL line 206 and the opposite terminal to circuit ground. Its gate terminal is connected to the DRLB line 208. The DRLB line 208 is selectively coupled to circuit ground through N-channel transistor 222 which has its gate terminal coupled to receive a read enable bar ("RENB") signal on line 226. Another N-channel transistor 224 couples the DRL line 206 to circuit ground and also has its gate terminal connected to the RENB line 226.

Figure 3:
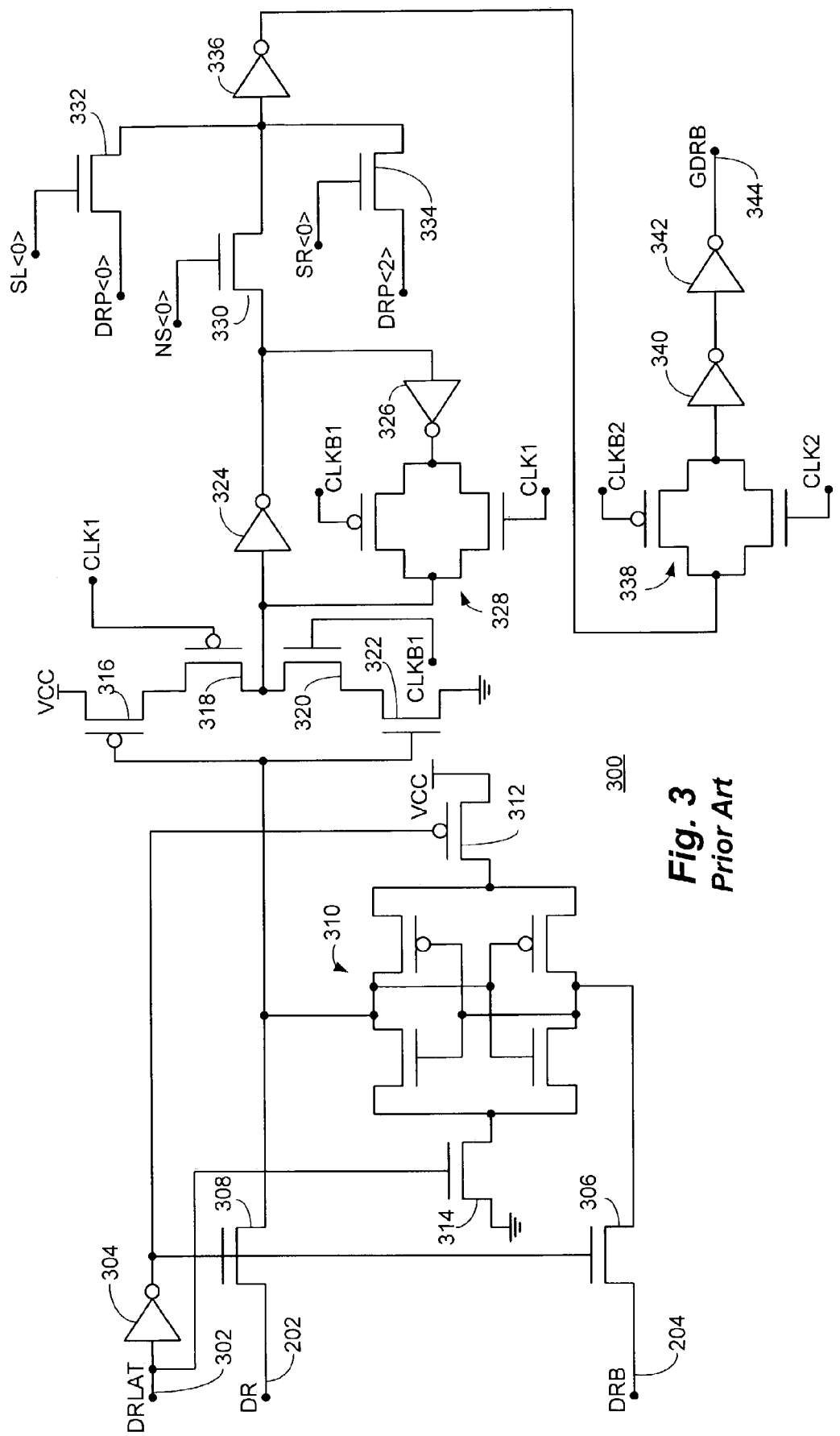
FIG. 3 is a schematic illustration of a prior art bank interface circuit also forming a portion of the conventional SDRAM device of FIG. 1.

With reference additionally now to FIG. 3, a schematic illustration of a prior art bank interface circuit 300 is shown. The bank interface circuit 300 also forms a portion of the conventional SDRAM device of FIG. 1 (therein illustrated as bank interface 106).

The bank interface circuit 300 receives the DR and DRB signals on lines 202 and 204 respectively as well as a DR latch ("DRLAT") signal on line 302. The DRLAT signal is inverted by inverter 304 and applied to the gates of N-channel transistors 306 and 308 which respectively couple the DRB signal on line 204 and the DR signal on line 202 to the inputs of a latch 310 comprising a pair of cross-coupled complementary metal oxide semiconductor ("CMOS") inverters. A P-channel transistor 312 couples the latch 310 to VCC and has its gate coupled to the output of the inverter 304 while an N-channel transistor 314 couples the latch 310 to circuit ground and has its gate coupled to line 302.

The DR signal on line 202, as controlled by transistor 308 in response to the inverted DRLAT signal, is coupled to the gate terminal of a P-channel transistor 316 which is coupled in series between VCC and circuit ground with P-channel transistor 318 and N-channel transistors 320 and 322 as shown. The gate terminal of transistor 316 is also connected to the gate terminal of transistor 322. The gate terminal of transistor 318 is coupled to a clocking signal CLK1 while its complement, CLKB1 is coupled to the gate of transistor 320.

The node intermediate transistors 318 and 320 is coupled to the input of an inverter 324 and to the output of a CMOS transmission gate 328 comprising parallel coupled P-channel and N-channel transistors which have their gate terminal coupled to receive the CLKB1 and CLK1 signals respectively. Another inverter 326 is coupled between the output of the inverter 324 and the input of the CMOS transmission gate 328. The output of inverter 324 is also coupled to one terminal of N-channel transistor 330 which has its gate connected to receive a "no shift" ("NS<0>") signal. The other terminal of transistor 330 is coupled to the input of inverter 336 which is also coupled to receive a "data read prime" ("DRP<0>") signal through N-channel transistor 332 in response to a "shift left"("SL<0>") signal as well as a DRP<2> signal through N-channel transistor 334 in response to a "shift right" ("SR<0>") signal. The "no shift", "shift left" and "shift right" signals are repair control signals for redundant column selection. The "data read prime" signals ("DRP<0>" and "DRP<2>") represent adjacent data lines that could be shifted onto the output indicated if a defect is present.

The output of the inverter 336 is coupled to the input of a second CMOS transmission gate 338 comprising parallel coupled P-channel and N-channel transistors and have their gate terminal coupled to receive complementary second clocking signals CLKB2 and CLK2 respectively. Output from the transmission gate 338 is coupled to the GDRB line 344 through series connected inverters 340 and 342 as shown.

Figure 4:
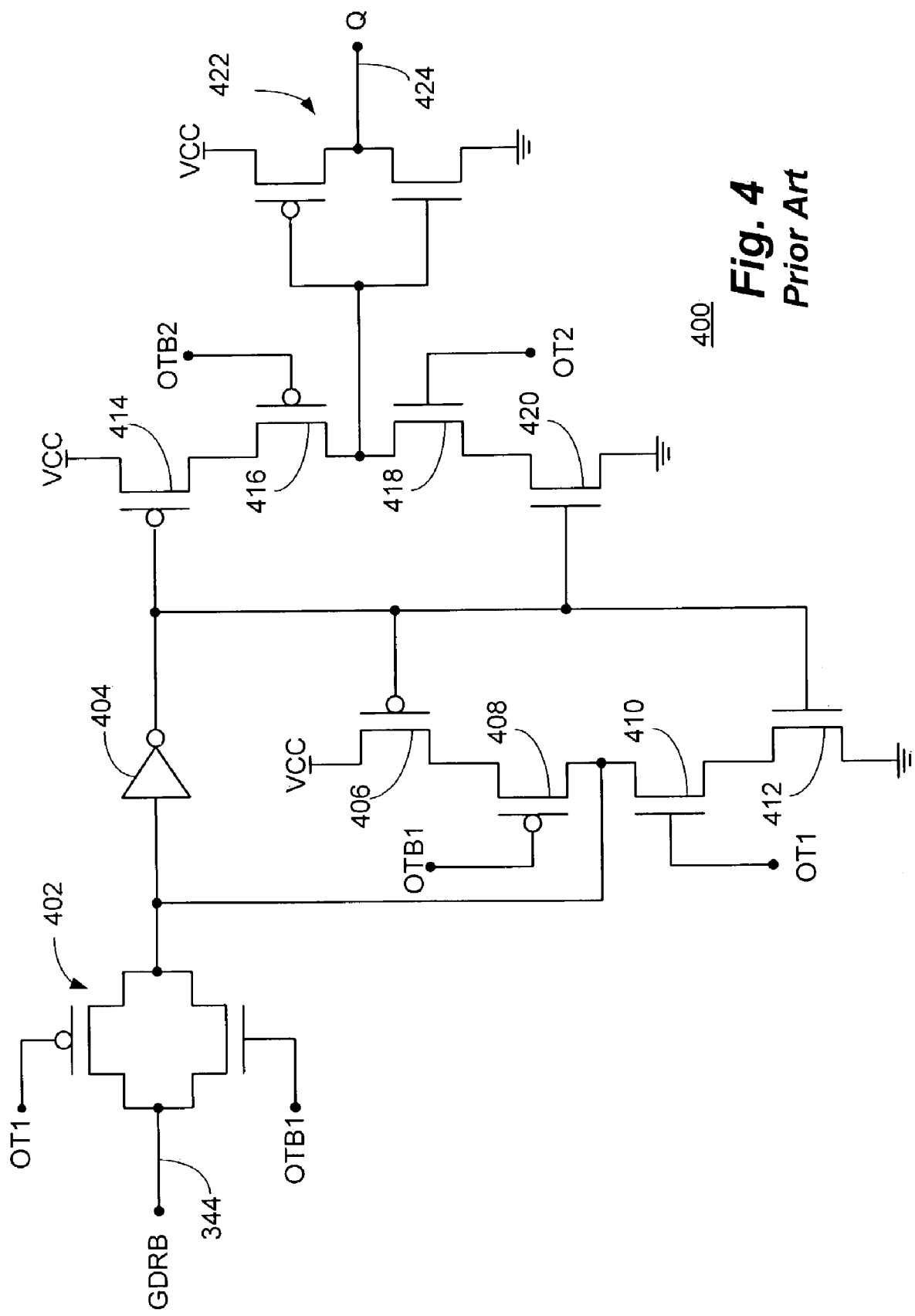
FIG. 4 is a schematic illustration of a prior art memory interface circuit (or output buffer) further forming a portion of the conventional SDRAM device of FIG. 1.

With reference additionally now to FIG. 4, a schematic illustration of a prior art memory interface circuit 400 (or output buffer) is shown. The memory interface circuit 400 also forms a portion of the memory device 100 of FIG. 1 and is therein illustrated as output buffer 104.

As depicted, the memory interface circuit 400 receives the GDRB signal on line 344 through another CMOS transmission gate 402 comprising parallel connected P-channel and N-channel transistors. The gate of the P-channel device is coupled to receive an OT1 signal while the gate terminal of the N-channel device receives a complementary OTB1 signal. Output from the CMOS transmission gate 402 is connected to the input of an inverter 104 which has its output coupled to the gate terminal of a P-channel transistor 406. The transistor 406 is connected in series between VCC and circuit ground with P-channel transistor 408 and N-channel transistors 410 and 412. The gate terminal of transistor 406 is coupled to the gate terminal of transistor 412 while the gate terminal of transistor 408 is coupled to OTB1 and the gate terminal of transistor 410 is coupled to OT1. The node intermediate transistors 408 and 410 is coupled to the input of the inverter 404.

The output of the inverter 404 is also coupled to the gate terminal of P-channel transistor 414. The transistor 414 is connected in series between VCC and circuit ground with P-channel transistor 416 and N-channel transistors 418 and 420. The gate terminal of transistor 414 is coupled to the gate terminal of transistor 420 while the gate terminal of transistor 416 is coupled to receive a signal OTB2 and the gate terminal of transistor 418 is coupled to receive its complement, OT2. The node intermediate transistors 416 and 418 is coupled to the input of an inverter 422 comprising a series connected P-channel and N-channel transistor. Output from the inverter 422 is supplied on data out ("Q") line 424.

Figure 5:
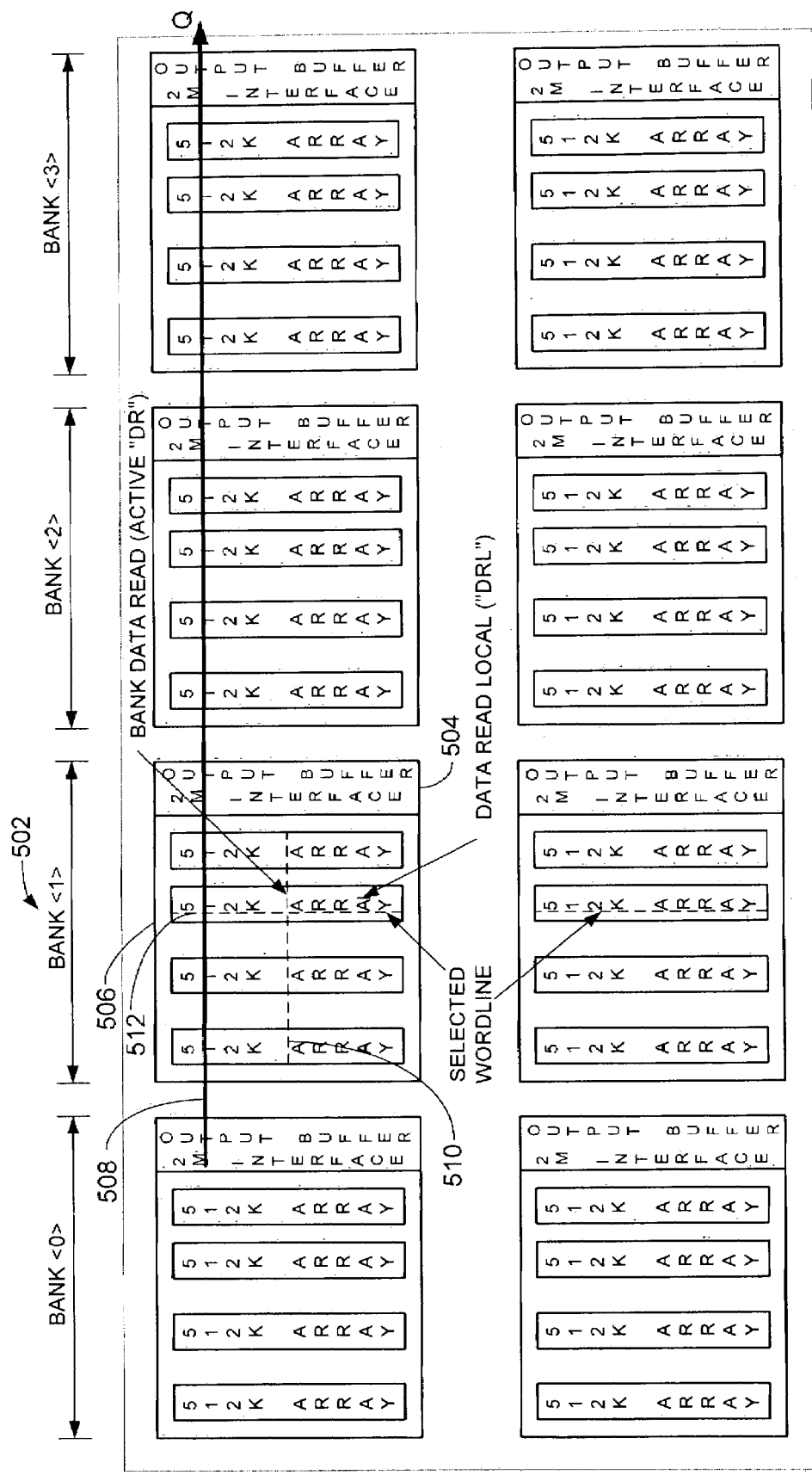
FIG. 5 is a simplified functional block diagram of a representative implementation of an integrated circuit memory device incorporating a reduced gate delay multiplexed output buffer in accordance with the present invention.

With reference additionally now to FIG. 5, a simplified functional block diagram of a representative implementation of an integrated circuit memory device 500 incorporating a reduced gate delay multiplexed output buffer 516 in accordance with the present invention is shown. The memory device 500 includes a number of memory banks 502 and does not require an output buffer 104 as in the conventional memory device 100 of FIG. 1.

Each of the banks 502 includes a respective bank interface and output buffer 504 as will be more fully described hereinafter. A number of individual memory arrays 506, each comprising a number of sub-arrays, together with the bank interface and output buffers 504 form the memory device 500 memory array.

A data output ("Q") line 508 provides the data to be read from the memory banks 502 and is coupled to each of the bank interface and output buffers 504. As shown, each of the memory banks 502 has a respective bank data read line ("DR"; the complementary "DRB" lines are not shown) 510. Clocked sub-array interfaces (not shown) are coupled to data read local lines ("DRL"; the complementary "DRLB" lines are not shown) 512 as illustrated.

With reference additionally now to FIG. 6, a schematic illustration of a sub-array interface circuit 600 is shown for possible use in conjunction with the memory device 500 of the preceding figure. The sub-array interface circuit 600 receives complementary DRL and DRLB signals on lines 602 (analogous to line 512 in FIG. 5) and 604 respectively as well as read enable ("REN") and complementary read enable bar ("RENB") signals on lines 606 and 608 respectively. An N-channel transistor 610 is coupled across lines 602 and 604 and has its gate terminal coupled to line 608. Another N-channel transistor 612 is coupled between line 604 and DRB line 618 while a third N-channel transistor 614 is coupled between line 602 and DR line 616 (analogous to line 510 in FIG. 5). The gate terminals of transistors 612 and 614 are coupled to REN line 606.

Figure 7:
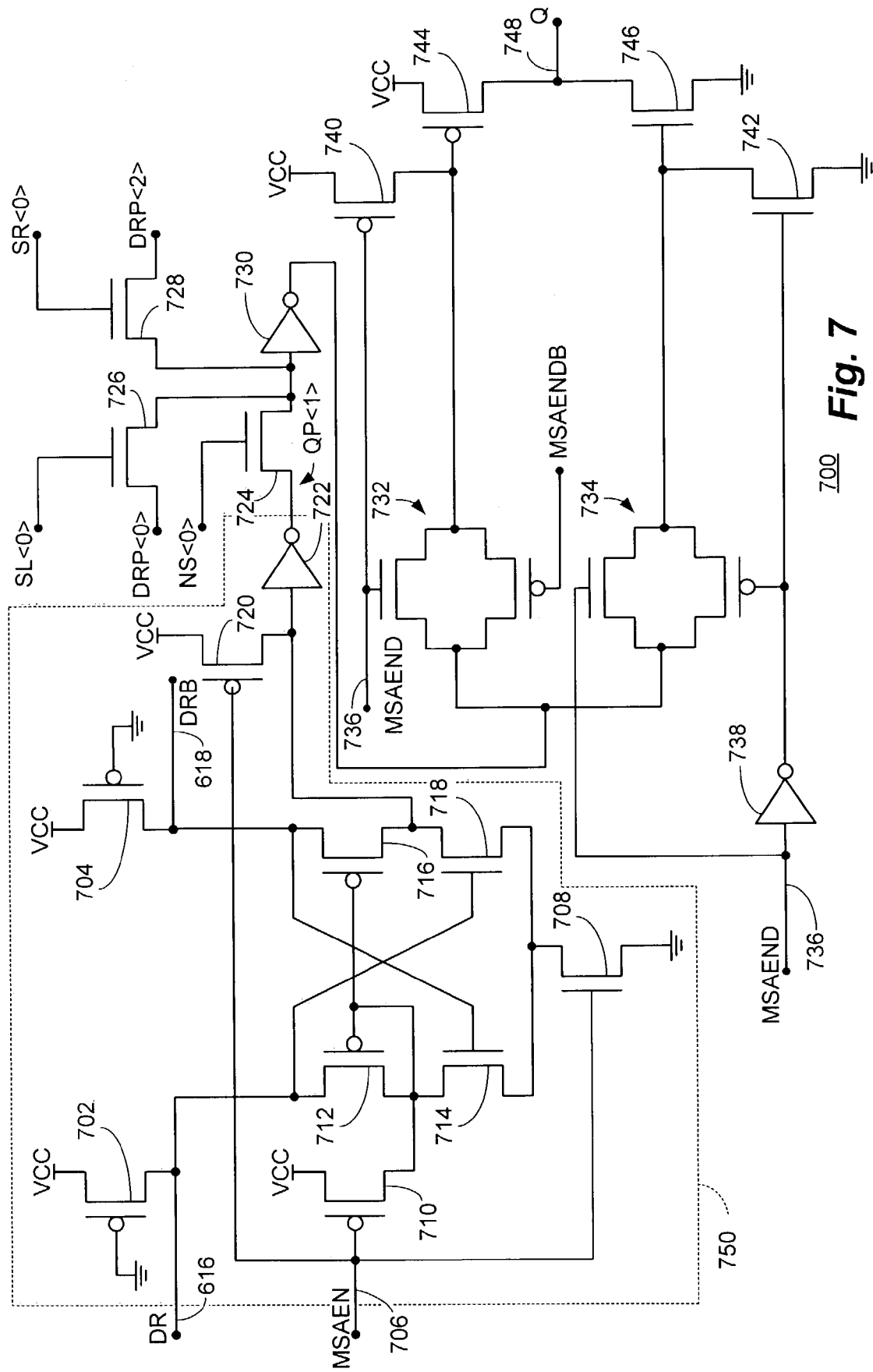
FIG. 7 is a schematic illustration of a novel bank interface circuit for possible use in conjunction with the memory device of FIG. 5.

With reference additionally now to FIG. 7, a schematic illustration of a novel bank interface and output buffer circuit 700 is shown. The bank interface and output buffer circuit 700 may be used, for example, as a portion of the memory device 500 shown in FIG. 5 and receives complementary DR and DRB signals on lines 616 and 618 respectively.

A P-channel transistor 702, which has its gate terminal connected to circuit ground, is coupled between line 616 and VCC. Similarly, another P-channel transistor 704, which also has its gate terminal connected to circuit ground, is coupled between line 618 and VCC. A main sense amplifier enable ("MSAEN") signal on line 706 is coupled to the gate of P-channel transistor 710 which has one terminal coupled to VCC. The other terminal of transistor 710 is coupled to the gate terminal of P-channel transistor 712 as well as the node intermediate transistor 712 and N-channel transistor 714. The other terminal of transistor 712 is connected to line 616 while the other terminal of transistor 714 is selectively coupled to circuit ground through N-channel transistor 708 which has its gate terminal coupled to line 706.

P-channel transistor 716 is coupled to DRB line 618 and to N-channel transistor 718 which, in turn, is coupled to transistor 708 as shown. The gate terminal of transistor 716 is connected to the gate terminal of transistor 712 while the gate terminal of transistor 714 is coupled to DRB line 618 and the gate terminal of transistor 718 is coupled to DR line 616. The MSAEN signal on line 706 is coupled to the gate terminal of P-channel transistor 720 which has one terminal connected to VCC and the other to the node intermediate transistors 716 and 718 at the input of an inverter 722.

The output of the inverter 722 is connected through an N-channel transistor 724 to the input of another inverter 728. The gate terminal of transistor 724 receives an NS<0> signal while N-channel transistor 726 couples a DRP<0> signal to the input of the inverter 730 in response to an NS<0> signal. Similarly, an N-channel transistor 728 couples a DRP<2> signal to the input of the inverter 730 in response to an SR<0> signal. The output of inverter 730 is coupled to the inputs of two CMOS transmission gates 732 and 734, each comprising a pair of parallel connected P-channel and N-channel transistors.

A delayed enable signal or main sense amplifier enable delay ("MSAEND") signal on line 736 is supplied to the N-channel devices of the transmission gates 732 and 734. An inverter 738 is connected to line 736 to supply an inverted signal ("MSAENDB") to the P-channel devices of the transmission gates 732 and 734. A P-channel transistor 740 receives the MSAEND signal at its gate terminal on line 736 and is coupled between VCC and the output of the transmission gate 732. An N-channel transistor 742 receives the MSAENDB signal at its gate terminal and is coupled between circuit ground and the output of the transmission gate 734. P-channel transistor 744 and N-channel transistor 746 are connected in series between VCC and circuit ground and the node intermediate the two defines the data output ("Q") line 748 (analogous to line 508 of FIG. 5). The gate terminal of transistor 744 is coupled to the output of transmission gate 732 while the gate terminal of transistor 746 is coupled to the output of transmission gate 734.

The main sense amplifier 750 (indicated by the dashed line) of the bank interface circuit 700 comprises transistors 702, 704, 708, 710, 712, 714, 716, 718, 720 and inverter 722. The output of the main sense amplifier 750 is the signal data output prime ("QP<1>") at the input of inverter 730.

While there have been described above the principles of the present invention in conjunction with specific circuitry and implementations, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit device comprising:
    a memory array including a plurality of memory banks
    a plurality of sub-array interface circuits coupled to complementary data read local lines of said device, each receiving a read enable signal, and each further coupled to complementary data read lines; and
    a plurality of interface and output buffer circuits, wherein each of said plurality of memory banks includes a respective bank interface and output buffer circuit, and wherein each of said plurality of interface and output buffer circuits is coupled to a data output line of said device and receives a main sense amplifier enable signal to provide a data output signal,
    wherein there are no additional clocked stages between a sub-array interface circuit and a corresponding interface and output buffer circuit.

2. The integrated circuit device of claim 1 wherein said interface and output buffer circuit comprises:
    a main sense amplifier coupled to complementary data read lines and a main sense amplifier enable signal to provide a data output signal.

3. The integrated circuit device of claim 2 wherein said interface and output buffer circuit further comprises:
    an output stage coupled to receive said data output signal, said data output stage receiving at least one main sense amplifier delay signal and operative to selectively couple said data output signal to said data output line in response to said main sense amplifier delay signal.

4. The integrated circuit device of claim 3 wherein said output stage further comprises:
    first and second pass gates coupled to receive said data output signal and operative in response to complementary ones of said at least one main sense amplifier delay signal to couple said data output signal to said data output line.

5. The integrated circuit device of claim 4 wherein said first and second pass gates comprise CMOS transmission gates.

6. The integrated circuit device of claim 4 wherein said output stage further comprises:
    first and second output switching devices defining an output node coupled to said data output line, said first output switching device having a control terminal thereof coupled to an output of said first pass gate and said second output switching device having a control terminal thereof coupled to an output of said second pass gate.

7. The integrated circuit device of claim 6 wherein said first and second output switching devices comprise MOS transistors.

8. The integrated circuit device of claim 7 wherein said first output switching device is a P-channel device and said second output switching device is an N-channel device.

9. The integrated circuit device of claim 6 further comprising:
    a pull-up device for selectively coupling said output of said first pass gate to a supply voltage source in response to a first state of said main sense amplifier delay signal; and
    a pull-down device for selectively coupling said output of said second pass gate to a reference voltage source in response to a second opposite state of said main sense amplifier delay signal.

10. The integrated circuit device of claim 9 wherein said pull-up and pull-down devices comprise MOS transistors.

11. The integrated circuit device of claim 10 wherein said pull-up device comprises a P-channel device and said pull-down device comprises an N-channel device.

12. The integrated circuit device of claim 1 wherein
    an interface and output buffer circuit of the plurality of interface and output buffer circuits is associated with each of said plurality of memory banks, said interface and output buffer circuit comprising a main sense amplifier circuit operative in response to an enable signal and an output stage coupled to said main sense amplifier circuit and a data output line of said device and operative in response to a delayed enable signal.

13. The integrated circuit device of claim 12 wherein said main sense amplifier is coupled to said complementary data read lines and said enable signal to provide a data output signal.

14. The integrated circuit device of claim 13 wherein said output stage is coupled to receive said data output signal and is operative to selectively couple said data output signal to said data output line in response to said delayed enable signal.

15. The integrated circuit device of claim 14 wherein said output stage further comprises:
    first and second pass gates coupled to receive said data output signal and operative in response to said delayed enable signal to couple said data output signal to said data output line.

16. The integrated circuit device of claim 15 wherein said first and second pass gates comprise CMOS transmission gates.

17. The integrated circuit device of claim 15 wherein said output stage further comprises:
    first and second output switching devices defining an output node coupled to said data output line, said first output switching device having a control terminal thereof coupled to an output of said first pass gate and said second output switching device having a control terminal thereof coupled to an output of said second pass gate.

18. The integrated circuit device of claim 17 wherein said first and second output switching devices comprise MOS transistors.

19. The integrated circuit device of claim 18 wherein said first output switching device is a P-channel device and said second output switching device is an N-channel device.

20. The integrated circuit device of claim 16 further comprising:
- a pull-up device for selectively coupling said output of said first pass gate to a supply voltage source in response to a first state of said delayed enable signal; and
- a pull-down device for selectively coupling said output of said second pass gate to a reference voltage source in response to a second opposite state of said delayed enable signal.

21. The integrated circuit device of claim 20 wherein said pull-up and pull-down devices comprise MOS transistors.

22. The integrated circuit device of claim 21 wherein said pull-up device comprises a P-channel device and said pull-down device comprises an N-channel device.

* * * * *